Feb. 22, 1966 HUNG CHANG LIN 3,236,701

DOUBLE EPITAXIAL LAYER FUNCTIONAL BLOCK

Filed May 9, 1962

INVENTOR.
HUNG CHANG LIN

BY

Frederick Shapoe
ATTORNEY

United States Patent Office 3,236,701

Patented Feb. 22, 1966

3,236,701

DOUBLE EPITAXIAL LAYER FUNCTIONAL BLOCK

Hung Chang Lin, Monroeville, Pa., assignor to Westinghouse Electric Corporation, East Pittsburgh, Pa., a corporation of Pennsylvania Filed May 9, 1962, Ser. No. 193,452
7 Claims. (Cl. 148—33.5)

This invention relates to semiconductor material and in particular comprises a semiconductive monolith that is useful in the production of a wide variety of semiconductor functional blocks.

In a monolithic semiconductor functional block, one of the most serious problems encountered is the undesirable cross talk between different regions. Ordinarily, the major portion of the substrate serves as the collector for any double diffused transistors in the block. If the substrate resistivity is low, a short circuit is formed between the different collectors or between any regions which are coupled to the collectors. If the substrate resistivity is very high, the saturation resistance of the transistors is usually excessively high.

Heretofore, the practice adopted to overcome this situation has been the use of a high resistivity substrate in which a heavily doped cavity is provided behind the collector junctions to lower the saturation resistance. That solution to the problem has certain undesirable characteristics in that the processing steps required to produce the resulting structure are tedious, the depth of the cavities is difficult to control to the accuracy desired and the resulting structure becomes fragile due to cavities produced.

It is therefore a primary object of the present invention to provide a semiconductor monolith having a plurality of interrelated doped regions which can thereafter be fabricated into many different semiconductor functional blocks without encountering undue cross talk between different regions.

Another object of the invention is to provide a semiconductor monolith including two epitaxial layers that may be electrically separated in order to produce functional blocks having outstanding electrical characteristics.

Other objects will be apparent from the following detailed description and discussion of the invention.

The invention will be most readily understood upon considering its description in conjunction with the attached drawings in which.

It should be understood that the drawings are adapted for visual clarity and are not to scale.

In accordance with the present invention, there is provided a semiconductor monolith comprising a unitary body of semiconductor material having a first substantial portion or substrate or intrinsic or high resistivity P or N type semiconductor material, a first degenerate epitaxial layer of the semiconductive material on a major surface of the substrate and a moderate resistivity epitaxial layer having a conductivity of the type used in the first-mentioned epitaxial layer on the upper surface of that first epitaxial layer. Generally, the degenerate layer is of a resistivity of less than about 0.01 ohm cm. and preferably within the range of about 0.005 to about 0.008 ohm cm., while the moderate resistivity layer ordinarily is of a resistivity of about 0.05 to 2 ohm cm. Their resistivities are, however, design considerations and can be varied to suit the needs of the particular device that is to be prepared. The sandwiched epitaxial layer, being degenerate, provides the low saturation resistance. The surface epitaxial layer is characterized by moderate resistivity and thus is suitable for making good collector junctions. With this structure, cross talk is avoided by isolating regions of the epitaxial portions thereof, as by etching through both epitaxial layers into the intrinsic or high resistivity substrate so that the only contact of the resulting portions of epitaxial layers of the same resistivity characteristics is mechanical and is through the substrate. In the case where the substrate is of opposite conductivity from the collector, the reverse biased junction resulting provides further isolation. In this simple fashion, a device is provided that enables great simplification in the fabrication of monolithic functional blocks and results in superior electrical characteristics.

For ease of description and understanding, the present invention will be described specifically in terms relating to semiconductive silicon. However, it will be understood that other semiconductive materials may be used such, for example, as germanium, to provide analogous structures. It should also be understood that the silicon or other semiconductor used can be processed so that the semiconductivity of the various regions may be reversed in preparing the devices.

Figure 1:
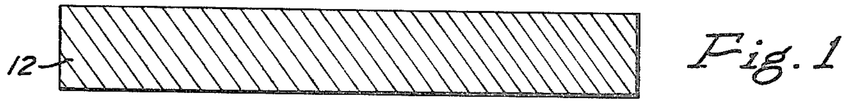
FIG. 1 is a side view of a wafer of semiconductor material used in preparing an embodiment of the invention.

Referring to FIG. 1, there is illustrated a single crystal silicon wafer 12 that is intrinsic or is of high resistivity P or N type semiconductivity. The wafer 12 can be prepared by any of many methods available in the art. By way of example, a single crystal silicon rod can be pulled from a melt comprised of silicon and at least one element from Groups III or V of the Periodic Table, depending on the type conductivity desired if non-intrinsic material is to be used. Of course, the Group III or Group V element would be omitted where intrinsic material was desired. A wafer can be cut from the rod with, for example, a diamond saw. Its surfaces can be smoothed by lapping, etching, or the like if desired. A section of a dendritic crystal prepared in accordance with United States Patent Application Serial No. 844,288, filed October 5, 1959, now Patent 3,031,403, also can be used as the semiconductive material. Typically, the silicon would be on the order of 250 ohm cm. P type or on the order of 175 ohm cm. N type material though lower or higher resistivity material can be used if desired.

The specific method of providing epitaxial layers of semiconductive material forms no part of the present invention. While many methods therefor are available, such layers or films can easily be provided with controlled thickness and conductivity type by hydrogen reduction of doped silicon tetrachloride. For this purpose, the wafer is disposed in a reaction zone such as a water-cooled quartz reaction vessel. A means is provided for saturating a stream of hydrogen with silicon tetrachloride. The furnace is provided with a heater such as a radio frequency generator whereby the wafer can be heated to a suitable temperature, i.e. above about 1200° C. for silicon. The silicon wafer is placed on a silicon or graphite heating pedestal within the quartz reaction vessel. Dry hydrogen is first passed through the vessel so that all surface oxide is removed from the crystal. Such treatment can be carried out, for example, at 1295° C. for one-half hour or more. Thereafter, the temperature of the silicon crystal is lowered to the desired tetrachloride decomposition temperature, for example, 1270° C.

Figure 2:
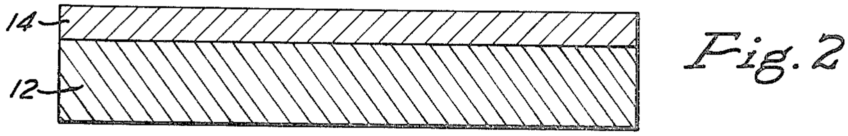
FIG. 2 is a side view of the semiconductive material being processed in accordance with the invention.
Figure 3:
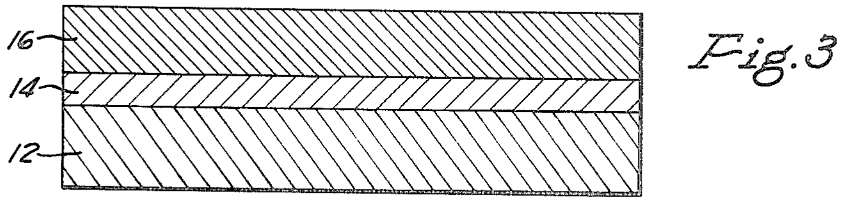
FIG. 3 is a side view of a device in accordance with this invention showing two epitaxial layers.

The silicon tetrachloride is heated to a temperature sufficient to provide it in a concentration of about two mol percent in hydrogen. The doping material that is to be used suitably also is in the chloride or other halide form and may be included with the silicon tetrachloride. Alternatively, the doping material can be supplied by using a separate saturator. In either event, sufficient of the doping material is used initially to provide a very high concentration of the impurity in the first layer of epitaxial silicon to be produced on the silicon substrate. For example, with arsenic as the conductivity impurity, sufficient of it is used to provide a concentration on the order of $5\times10^{19}$ atoms per $cm.^3$ of the resulting degenerate epitaxial layer. With the saturator activated, hydrogen is passed into the vessel at a flow rate of about one liter per minute. At these conditions, there results a layer of epitaxial silicon of over one micron thick per minute. For example, in about five minutes, a layer 6 to 8 microns thick can be readily produced. After the first layer is produced, the concentration of the doping impurity is reduced by using a second saturator containing silicon tetrachloride doped to a lower level to result in the desired resistivity of the next layer and gas flow under the changed conditions is continued until a second and moderate resistivity epitaxial layer results. The first such epitaxial layer, which is denegerate, is indicated by the numeral 14 (FIG. 2) and the second, which is of moderate resistivity, is indicated in the drawings as 16 (e.g. FIG. 3). While any desired thickness for the epitaxial layers can be used, they generally are on the order of 0.3 to 0.6 mil thick. The resulting double epitaxial layer monocrystalline functional block can now be used in producing various electronic devices.

Figure 4:
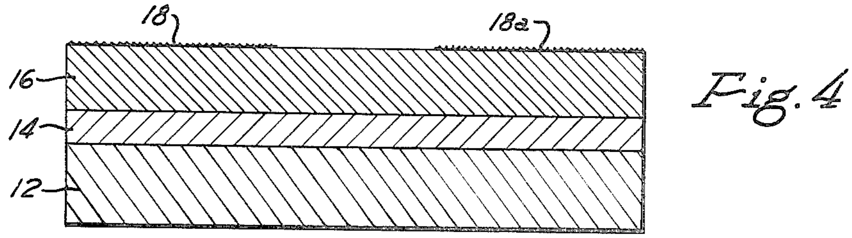
FIG. 4 is a side view of the device of FIG. 4 being further processed.

For example, portions of the two epitaxial layers can be electrically isolated by etching away a portion of them and continuing the etching into the intrinsic substrate 12. This can be accomplished by coating the portions of the device that are not to be removed with a suitable material such as Apiezon wax, the spaced portions of which are indicated by the numerals 18 and 18*a* in FIG. 4. Then the exposed portions are removed with a suitable silicon etchant. A typical etchant that can be used comprises, by volume, 3 parts nitric acid, one part hydrofluoric acid and one part acetic acid. Etching is continued until the exposed portions of the epitaxial layers are removed along with a small portion, of a size to insure that shorting does not occur, of the intrinsic substrate 12. After etching has been completed, the masking wax is removed. A similar result can be achieved with conventional photo-resist techniques as well as with other procedures available to the art.

Figure 5:
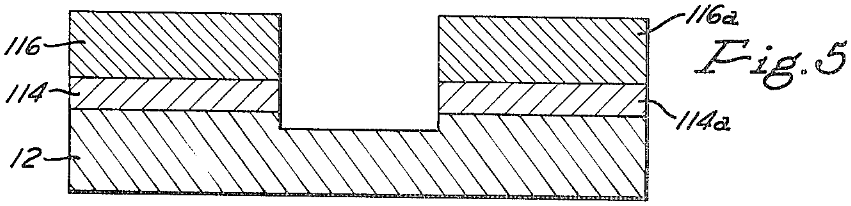
FIG. 5 is a side view of a second device of the invention showing isolated epitaxial layers.

The resulting device as shown in FIG. 5 is characterized by having separated regions 114 and 114*a* of the degenerate epitaxial silicon as well as separated regions 116 and 116*a* of the moderate epitaxial silicon that are electrically isolated from one another. At the same time, those regions are mechanically connected through the remaining continuous portion of the intrinsic substrate 12. This block is now processed with conventional techniques, for example those used in producing planar transistors or the like, to obtain any desired structure.

Figure 6:
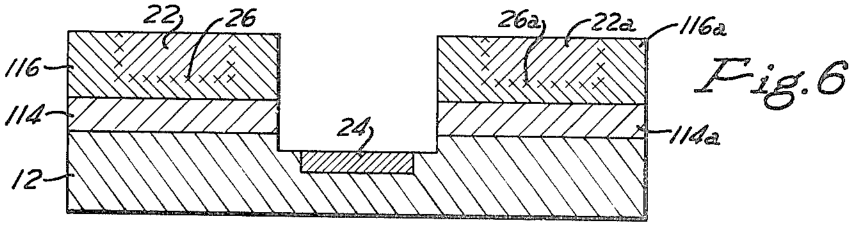
FIGS. 6 and 7 show a structure as in FIG. 5 in further stages of processing to produce a semiconductive functional block.
Figure 7:
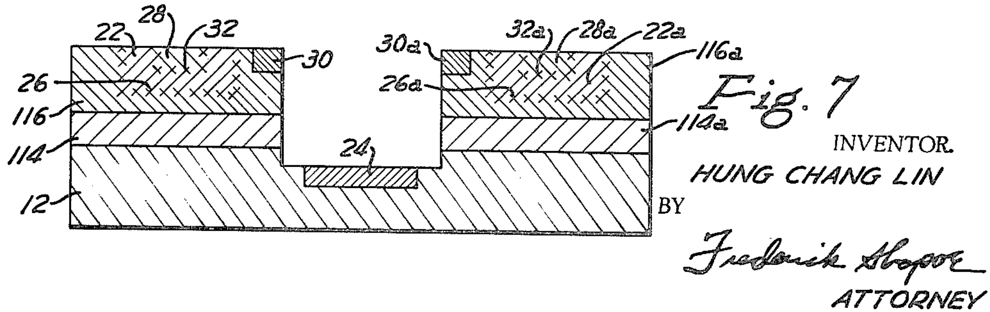

By way of example, a P-type layer may be selectively diffused into the substrate and the surfaces of the N-type epitaxial regions 116 and 116*a*, through an oxide coating such as silicon oxide, parts of which have been removed to permit diffusion. For this purpose, the wafer with surfaces suitably protected is disposed in a diffusion furnace having its hottest zone at a temperature within the range of about 1100° C. to 1250° C. and having an atmosphere of an acceptor doping material, for example, indium, gallium, aluminum, or boron therein. The acceptor material can be provided in a crucible heated to a temperature within the range of about 600° to 1200° C., the specific temperature being chosen to insure the desired vapor pressure and concentration of diffusant at the surface of the silicon. The acceptor impurity is diffused into the exposed surfaces of the substrate 12 and the epitaxial layers 116 and 116*a*. This forms a P-type region 22 and 22*a* in the epitaxial layers 116 and 116*a* respectively, and a low resistivity zone 24 in the substrate 12 that, respectively, serve as bases of transistors and the resistance for a functional block, as shown in FIG. 6. At the interface of the P-regions 22 and 22*a* within the portions 116 and 116*a* of the moderate resistivity epitaxial silicon there is thus formed P-N junctions 26 and 26*a* respectively. The N-type zones may be selectively produced in the surfaces of the P-regions 22 and 22*a* and in the epitaxial regions 116 and 116*a* to form the emitters 28 and 28*a* of the transistors and collector contacts 30 and 30*a* respectively. Diffusion of these N-type materials, which may, for example, be antimony, arsenic, phosphorus or the like, is carried out in the same general fashion as for the diffusion of P-type materials as just noted. At the interface of the emitters 28 and 28*a* and the bases 22 and 22*a*, there are formed second P-N junctions 32 and 32*a*, respectively, in each of the separated portions 116 and 116*a* of epitaxial silicon. Of course, emitters 28 and 28*a* and the contacts 30 and 30*a* could as easily be produced by using suitably doped foils and alloying or fusing the foils to the appropriate portions of the device, as by heating in a vacuum on the order of at least $10^{-2}$ mm. Hg, at a temperature of about 400° to 700° C. By way of example, a typical foil for this purpose would be an alloy composed of 99.0 to 99.5 percent gold and 0.5 to one percent antimony. However produced, leads, encapsulation and the like are then provided for the device in accordance with known techniques.

In consequence of producing the device in the double epitaxial layer block in this invention, the resistance between the collector junctions 26 and 26*a* and the collector contacts 30 and 30*a* (i.e. the saturation resistance) is very low because of the shorting of the degenerate epitaxial layer. The degenerate layer also shortens the storage time as in any conventional epitaxial transistors. At the same time, the moderate resistivity epitaxial layer provides the desired proper impurity gradient at the collector junction to yield sufficient collector breakdown voltage, i.e. normally about 20 to 50 volts. Accordingly, transistors, diodes and other devices with desirable electrical characteristics can be readily fabricated within a monolithic functional block without any undesirable cross talk.

The invention will be described further in conjunction with the following specific example in which the details are given by way of illustration and not by way of limitation.

An N-type silicon wafer 150 x 250 x 6 mils and having a resistivity of 200 ohm cm. is used. This is placed on a graphite heating pedestal within a watercooled quartz reaction vessel. A source of hydrogen is connected to the reaction vessel. A saturator containing silicon tetrachloride heavily doped with arsenic chloride is tapped into the hydrogen line externally of the reaction vessel. Heating means are provided for the saturator. Using a radio frequency generator, the silicon crystal within the reaction vessel is heated to 1295° C. for one-half hour while dry hydrogen flows therethrough to remove surface oxygen. Thereafter the temperature of the crystal is lowered to 1270° C. The silicon tetrachloride in the saturator is then heated to provide the desired concentration (e.g. 2 mol percent) in the hydrogen entraining it, and the resulting mixture is admitted to the reaction vessel at a flow rate of one liter per minute. In about five minutes there results an epitaxial layer about 5 microns thick having a resistivity of about 0.005 ohm cm.

Maintaining the rate of gas flow and the substrate temperature, but lowering the arsenic chloride concentration as by substituting a saturator containing silicon tetrachloride moderately doped with arsenic chloride, gas flow is continued for another five minutes and there results a second epitaxial layer about 5 microns thick of about 0.5 ohm cm. resistivity. At the end of this period the gas flow is stopped and the silicon substrate is permitted to cool to room temperature. These films are shown to be good single crystals having the orientation of the substrate by electron diffraction patterns which show Kukuchi lines.

The resulting block having the double epitaxial layers can now be used as desired. To isolate two sections of each layer, portions of the top surface are covered with Apiezon wax with the remainder of the crystal being uncoated. The crystal is then subjected to an etchant comprised, by volume, of 3 parts nitric acid, one part hydrochloric acid and one part acetic acid. Etching is continued until the high resistivity silicon has been penetrated. After etching is terminated, the wax is removed from the surfaces. The structure is now ready for use for producing a device as by diffusion of suitable N and P-layers and contacts and providing internal leads in the usual manner, for example as indicated in the general description of the invention.

From the foregoing discussion and description, it is evident that the present invention provides an important advance in semiconductor functional blocks. Devices have been prepared using blocks of my invention and have demonstrated the advantages expected. For example, collector characteristics of a transistor, in a block as described, made in the AND gate functional block showed low saturation resistance and the absence of four-layer switching action. Similarly, outstanding results have been achieved in a phonograph amplifier functional block and in NOR logic blocks. And indeed, it is apparent that the same pattern of advantages would be achieved in any other device built into the block of the present invention.

It should be understood that variations can be made from the details of the invention as described without departing from its scope. For example, semiconductive material other than silicon can be used and the epitaxial layers could be provided at other conditions, as is readily apparent to the artisan. For example, with a germanium substrate, the hydrogen reduction of germanium chloride containing boron trichloride or phosphorus trichloride or other donor or acceptor material, at a temperature of about 830° C. for ten minutes would result in an epitaxial film of about 5 microns. Other changes in details will occur to those skilled in the art.

While the invention has been described in conjunction with a specific embodiment, it should be understood that they are not to be construed as limiting on the invention.

I claim:

1. A semiconductor structure comprising, within a physically unitary body: a substrate, a first layer of semiconductive material disposed on a surface of said substrate and having a resistivity sufficiently low that said first layer is degenerate; a second layer of semiconductive material disposed on said first layer, said second layer being of the same semiconductivity type as said first layer and having a resistivity which is greater than that of said first layer; said first and second layers being disposed in separate, coincident, portions on said substrate and having in at least one of said separate portions a first region of semiconductive material in p-n junction forming relationship with said second layer; and a second region of semiconductive material in p-n junction forming relationship with said first region to form a structure operable as a transistor wherein the material of said first and second layers serves as the collector with said first layer providing a low saturation resistance and said second layer providing a good collector junction with said first region.

2. A semiconductor structure in accordance with claim 1 wherein: said substrate comprises a body of semiconductive material of opposite semiconductivity type to that of said first and second layers.

3. A semiconductor structure in accordance with claim 2 wherein: said substrate is of p-type semiconductivity with a resistivity on the order of 250 ohm-centimeters; said first and second layers are of opposite semiconductivity type to that of said substrate; said first layer has a resistivity of less than about 0.01 ohm-centimeters; and said second layer has a resistivity of from about 0.05 ohm-centimeters to 2 ohm-centimeters.

4. A semiconductor structure in accordance with claim 2 wherein: said substrate is of n-type semiconductivity with a resistivity on the order of 175 ohm-centimeters; said first and second layers are of opposite semiconductivity type to that of said substrate; said first layer has a resistivity of less than about 0.01 ohm-centimeters; and said second layer has a resistivity of from about 0.05 ohm-centimeters to 2 ohm-centimeters.

5. A semiconductor structure in accordance with claim 1 wherein: said first layer has a resistivity less than about 0.01 ohm-cm.; said second layer has a resistivity in the range of from about 0.05 ohm-cm. to about 2 ohm-cm. and said substrate has a resistivity appreciably greater than that of either of said first and second layers.

6. A semicoductor device capable of performing the functions of a plurality of individually interconnected components comprising: a substrate of a first type of semiconductivity; a first layer of semiconductive material of a second type of semiconductivity having a resistivity of less than about 0.01 ohm-cm. disposed on a major surface of said substrate; a second layer of semiconductive material of said second type of semiconductivity having a resistivity in the range of from about 0.05 ohm-cm. to about 2 ohm-cm. disposed on said first layer; said substrate and said first and second layers being united in a monocrystalline structure; said first and second layers being disposed in separate portions on said substrate for electrical isolation therebetween with the separate portions of said second layer having a configuration coincident with that of the separate portions of said first layer; at least one of said separate portions having a first semiconductive region in p-n junction forming relationship with said second layer and a second semiconductive region in p-n junction forming relationship with said first region to provide a structure operable as a transistor with low saturation resistance.

7. A semiconductor device in accordance with claim 6 wherein said substrate is of p-type silicon having a resistivity of the order of 250 ohm-cm., said first and second layers are of n-type silicon, said first region is of p-type semiconductivity, said second region is of n-type semiconductivity and a third semiconductive region of n-type semiconductivity is disposed on the exposed surface of said second layer to provide a low resistivity region for the formation of a collector contact thereon.

References Cited by the Examiner

UNITED STATES PATENTS

| | | | |
|---|---|---|---|
| 3,099,579 | 7/1963 | Spitzer et al. | 148—33 X |
| 3,100,276 | 8/1963 | Meyer | 148—33 |

OTHER REFERENCES

Proceedings of the IRE, September 1960, vol. 48, pp. 1642–1643.

Van Lighten: "Epitaxially Diffused Transistor Fabrication," IBM Technical Disclosure Bulletin, vol. 4, No. 10, March 1962, pages 58 and 59.

DAVID L. RECK, *Primary Examiner.*

RAY K. WINDHAM, *Examiner.*

M. A. CIOMEK, D. L. REISDORF, C. N. LOVELL, *Assistant Examiners.*